(12) United States Patent
Scher et al.

(10) Patent No.: US 7,358,649 B2
(45) Date of Patent: Apr. 15, 2008

(54) SMALL PIEZOELECTRIC AIR PUMPS WITH UNOBSTRUCTED AIRFLOW

(75) Inventors: Irving S. Scher, Oakland, CA (US); Peter Varadi, Albany, CA (US)

(73) Assignee: Siemens Technology-To-Business Center, LLC, Berkeley, CA (US)

( * ) Notice: Subject to any disclaimer, the term of this patent is extended or adjusted under 35 U.S.C. 154(b) by 0 days.

(21) Appl. No.: 11/440,147

(22) Filed: May 23, 2006

(65) Prior Publication Data

US 2006/0208614 A1 Sep. 21, 2006

Related U.S. Application Data (62) Division of application No. 10/366,782, filed on Feb. 13, 2003, now Pat. No. 7,061,161.

(60) Provisional application No. 60/357,455, filed on Feb. 15, 2002.

(51) Int. Cl.
*H01L 41/08* (2006.01)
(52) U.S. Cl. ........................ 310/333; 310/328
(58) Field of Classification Search ................ 310/311, 310/328, 333
See application file for complete search history.

(56) References Cited

U.S. PATENT DOCUMENTS

| | | |
|---|---|---|
| 3,743,446 A | 7/1973 | Mandroian |
| 4,011,474 A | 3/1977 | O'Neill |
| 4,063,826 A | 12/1977 | Riepe |
| 4,170,244 A | 10/1979 | Bernaerts |
| 4,285,247 A * | 8/1981 | Klobe ...................... 73/861.24 |
| 4,322,449 A | 3/1982 | Voss et al. |
| 4,498,851 A | 2/1985 | Kolm et al. |
| 4,512,933 A | 4/1985 | Harden |
| 4,595,338 A | 6/1986 | Kolm et al. |
| 4,684,328 A | 8/1987 | Murphy |
| 4,697,738 A | 10/1987 | Lange |
| 4,753,579 A | 6/1988 | Murphy |
| 4,780,062 A | 10/1988 | Yamada et al. |
| 4,834,619 A | 5/1989 | Walton |
| 4,923,000 A | 5/1990 | Nelson |
| 5,008,582 A | 4/1991 | Tanuma et al. |
| 5,256,159 A | 10/1993 | Newman |
| 5,419,780 A | 5/1995 | Suski |
| 5,520,715 A | 5/1996 | Oeftering |

(Continued)

FOREIGN PATENT DOCUMENTS

EP 0 012 743 A1 6/1980

(Continued)

OTHER PUBLICATIONS

"Piezo-Electric Heat Exchanger to Cool Notebook Systems", vol. 41, No. 01, Jan. 1998, IBM Technical Disclosure Bulletin, p. 83-84.

(Continued)

*Primary Examiner*—Thomas M. Dougherty (57) ABSTRACT

A T-shaped blade, or one or more hollow tubes, are vibrationally excited by one or more piezoelectric elements to generate an airflow from a free end of the blade or tube(s). The airflow may be directed to, or drawn away from, an electronic component to cool the electronic component.

13 Claims, 7 Drawing Sheets

U.S. PATENT DOCUMENTS

| | | | |
|---|---|---|---|
| 5,628,411 A | 5/1997 | Mills et al. | |
| 5,697,153 A | 12/1997 | Saaski et al. | |
| 5,702,618 A | 12/1997 | Saaski et al. | |
| 5,705,070 A | 1/1998 | Saaski et al. | |
| 5,861,703 A | 1/1999 | Losinski | |
| 5,936,328 A * | 8/1999 | Takano et al. | 310/323.02 |
| 5,982,801 A | 11/1999 | Deak | |
| 6,065,688 A | 5/2000 | Wilson et al. | |
| 6,073,486 A * | 6/2000 | Packard et al. | 73/105 |
| 6,164,140 A | 12/2000 | Kalinoski | |
| 6,252,769 B1 | 6/2001 | Tullstedt et al. | |
| 6,308,740 B1 | 10/2001 | Smith et al. | |
| 6,361,747 B1 | 3/2002 | Dion et al. | |
| 6,467,350 B1 | 10/2002 | Kaduchak et al. | |
| 6,576,042 B2 | 6/2003 | Kraus et al. | |
| 6,638,032 B1 | 10/2003 | Vanden Brande et al. | |
| 6,654,392 B1 | 11/2003 | Arbore et al. | |
| 6,738,231 B2 * | 5/2004 | Arya et al. | 360/294.4 |
| 7,001,014 B2 * | 2/2006 | Torii et al. | 347/72 |
| 2001/0001278 A1 | 5/2001 | Drevet | |
| 2002/0175596 A1 | 11/2002 | Garimella et al. | |
| 2003/0015035 A1 | 1/2003 | Kaduchak et al. | |
| 2003/0202292 A1 * | 10/2003 | Arya et al. | 360/294.4 |
| 2004/0207292 A1 * | 10/2004 | Scher et al. | 310/328 |
| 2004/0217671 A1 | 11/2004 | Rosenthal et al. | |
| 2005/0286176 A1 * | 12/2005 | Yao et al. | 360/294.4 |
| 2006/0006764 A1 | 1/2006 | Ganor et al. | |
| 2006/0290236 A1 * | 12/2006 | Ikehashi | 310/330 |

FOREIGN PATENT DOCUMENTS

| | | | |
|---|---|---|---|
| EP | 0 504 465 A1 | 9/1992 | |
| FR | 2538118 | 7/1984 | |
| GB | 2 225 133 A | 5/1990 | |
| JP | 56014930 | 2/1981 | |
| JP | 59158541 | 9/1984 | |
| JP | 60-018099 | 1/1985 | |
| JP | 61212699 | 9/1986 | |
| JP | 6219999 | 9/1987 | |
| JP | 3-112663 * | 5/1991 | 400/124.16 |
| JP | 03273670 | 12/1991 | |
| JP | 04065862 | 3/1992 | |
| JP | 04065863 | 3/1992 | |
| JP | 04070347 | 3/1992 | |
| JP | 61212699 | 9/1992 | |
| JP | 10-56215 | 2/1998 | |
| JP | 2000-120600 | 4/2000 | |
| JP | 2000-186699 | 7/2000 | |
| JP | 2000-205106 | 7/2000 | |
| JP | 2000-233009 | 8/2000 | |
| JP | 2000-334381 | 12/2000 | |
| JP | 2001-179180 | 7/2001 | |
| JP | 2002-130199 | 5/2002 | |
| WO | WO 80/02445 A1 | 11/1980 | |
| WO | WO 2004/096297 A1 | 11/2004 | |

OTHER PUBLICATIONS

A. Ihara and H. Watanabe, "On the Flow Around Flexible Plates, Oscillating With Large Amplitude", Journal of Fluids and Structures (1994) 8, 0889-9746; pp. 601-619.

J.S. Jensen, "Fluid Transport Due to Nonlinear Fluid-Structure Interaction", Journal of Fluids and Structures (1997) 11; 0889-9746; pp. 327-344.

Hu, Junhui et al., "A Standing Wave-Type Noncontact Linear Ultrasonic Motor", IEEE Transactions on Ultrasonics, Ferroelectrics, and Frequency Control, vol. 48, No. 3, May 2001, 0885-3010; pp. 699-708.

* cited by examiner

SMALL PIEZOELECTRIC AIR PUMPS WITH UNOBSTRUCTED AIRFLOW

CROSS-REFERENCE TO RELATED APPLICATION

This application is a divisional of commonly owned U.S. application No. 10/366,782 filed Feb. 13, 2003 now U.S. Pat. No. 7,061,161, which claims priority from commonly own U.S. Provisional Application No. 60/357,455 filed Feb. 15, 2002.

This application claims priority under 35 U.S.C. § 119 to U.S. Provisional Patent Application Ser. No. 60/357,455, entitled "Small Piezoelectric Air Pumps With Unobstructed Airflow", filed in the name of Scher et al. on Feb. 15, 2002, the contents of which are hereby incorporated by reference in their entirety for all purposes.

BACKGROUND

The present disclosure relates generally to cooling of electronic components, and more particularly to cooling of such components using piezoelectrically driven structures.

There is a general trend in the electronics industry toward smaller and higher power integrated circuits and electronic devices. As the operating frequency and number of transistors on each die increases, so does the heat produced. For example, in the past few years the power dissipated from central processing units of laptop computers has gone up from 4W (e.g., a 233 MHz Intel Pentium™ processor with MMX) to as much as 22W (e.g., a 1.2 GHz Intel Pentium III-M™ processor). Newer central processing units are using and dissipating even more energy. Heat generation and heat density in electronics will continue to increase as more processing power is desired in laptop computers, web servers, cellular telephones, cellular phone base stations, PDAs, and other electronic devices. Portable electronic devices will require more cooling and devices that have up to now relied on natural convection alone for cooling may henceforth require active cooling elements.

Conventional arrangements for cooling electronics include axial fans and heat sinks, either alone or in combination. Axial fans drive air by rotating a set of fan blades that are mostly perpendicular to the axis of rotation. The operating lifetime of an axial fan is directly related to the life expectancy of its bearings. Bearings that are smaller than those typically used in 25×25×12 mm axial fans do not last long. Thus, reducing the size of a fan and its bearings dramatically decreases the life expectancy of the fan. Consequently, axial fans are generally not reliable when made smaller than 25×25×12 mm. It is therefore problematic to include axial fans in many portable electronic devices.

Passive cooling systems that have no moving parts are often used in electronic devices because of the long lifetime of passive cooling systems. Heat sinks and heat pipes fall into this category. Heat sinks rely on natural convection over a large surface area to dissipate energy to ambient air. If the amount of energy to be dissipated is increased, the heat sink must have more surface area and therefore may need to be increased in size. This can make heat sinks undesirable when space is at a premium. Heat sinks therefore may not be suitable for cooling hot electronics in tight spaces. Heat pipes may function to move heat away from a local source, but heat pipes, like heat sinks, require large surface areas to dissipate heat through natural convection at a radiator. Moreover, heat pipes generally do not work well in small and confined spaces. Conventional cooling technologies typically do not operate well or reliably when miniaturized for use in portable electronics.

It has previously been proposed to construct fans by attaching a piezoelectric actuator to a fan blade to drive ambient air. Most of these designs use at least one substantially elongated, flat, cantilevered blade. The blade or blades are vibrated, typically by using a bending type piezoelectric element at or near the first bending mode natural frequency of the blade and piezoelectric element system. When two blades are used, they are vibrated out of phase with each other to reduce vibrations in the housing and mounting system. Such piezoelectric fan designs use low frequencies (under 400 Hz) to obtain large amplitudes at the free end of the cantilever blade. Also most move air by vortex shedding due to large vibration amplitudes at the free end of the blade or blades. Voltage requirements (over 100 V), fan blade displacement (over one inch displacement at the fan blade end) and cost have generally been too great for the piezoelectric cooling systems to be used successfully in portable electronics. Furthermore, the piezoelectric cooling devices cannot easily be scaled down because the natural frequencies of the blades increase as the size decreases, and the bending-type piezoelectric elements tend to perform poorly at the higher frequencies that are required.

It would be desirable to provide a cooling system that has one or more of the following characteristics: (a) be able to dissipate a large amount of heat in a small volume; and (b) fit easily into portable and non-portable electronic systems that have high packaging density. It would be further desirable that such a system be inexpensive, efficient, robust, operable from batteries and/or easy to design into a system. For the latter characteristic, it would be desirable that the system use surface mount technology.

SUMMARY

Apparatus and methods are therefore presented for improved cooling of electronic systems.

According to some embodiments, a cooling apparatus includes a tube and a piezoelectric element coupled to an end of the tube so as to apply force to the end of the tube. The piezoelectric element may cause the tube to vibrate so as to direct a gas such as ambient air to an electronic component such as a microprocessor. The piezoelectric element may be coupled to the end of the tube by a force transmission bar.

According to some embodiments, a cooling apparatus may include a plurality of tubes and a piezoelectric element coupled to respective ends of the tubes so as to apply a force to the ends of the tubes.

According to some embodiments, a cooling apparatus includes a T-shaped blade having a long leg and a cross-bar element mounted at a central region of the cross-bar element to one end of the long leg. The cooling apparatus further includes a pair of piezoelectric elements. Each of the piezoelectric elements is coupled to a respective end of the cross-bar element of the T-shaped blade.

According to some embodiments, a cooling apparatus includes a T-shaped blade having a long leg and a cross-bar element mounted at a central region of the cross-bar element to one end of the long leg. The cooling apparatus further includes a piezoelectric element coupled to a first end of the cross-bar element and a flexible support structure that supports a second end of the cross-bar element. The flexible support structure may include a pair of springs.

According to some embodiments, a cooling method may include providing a T-shaped blade, and using a piezoelectric element to drive an end of a cross-bar element of the T-shaped blade to direct air to an electronic component.

According to some embodiments, a cooling method may include providing a hollow tube, and using a piezoelectric element to drive an end of the hollow tube to direct air from another end of the tube to an electronic component.

According to some embodiments, a cooling apparatus includes a disk and an annulus positioned above and coaxial with the disk. The cooling apparatus also includes a plurality of ribs extending up from the disk to the annulus. Each rib corresponds to a respective radius of the disk. The ribs define passages that run from a space above a central region of the disk to a periphery of the disk. The cooling apparatus further includes a piezoelectric element on which the disk is mounted.

Further aspects of the instant system will be more readily appreciated upon review of the below detailed description of the specific embodiments in conjunction with the accompanying drawings.

DETAILED DESCRIPTION OF SPECIFIC EMBODIMENTS

According to some embodiments, a T-shaped blade or one or more hollow tubes are driven to vibrate by one or more piezoelectric elements in such a way as to generate an airflow. For example, air may be directed to or drawn away from an electronic component such as a microprocessor.

Figure 1:
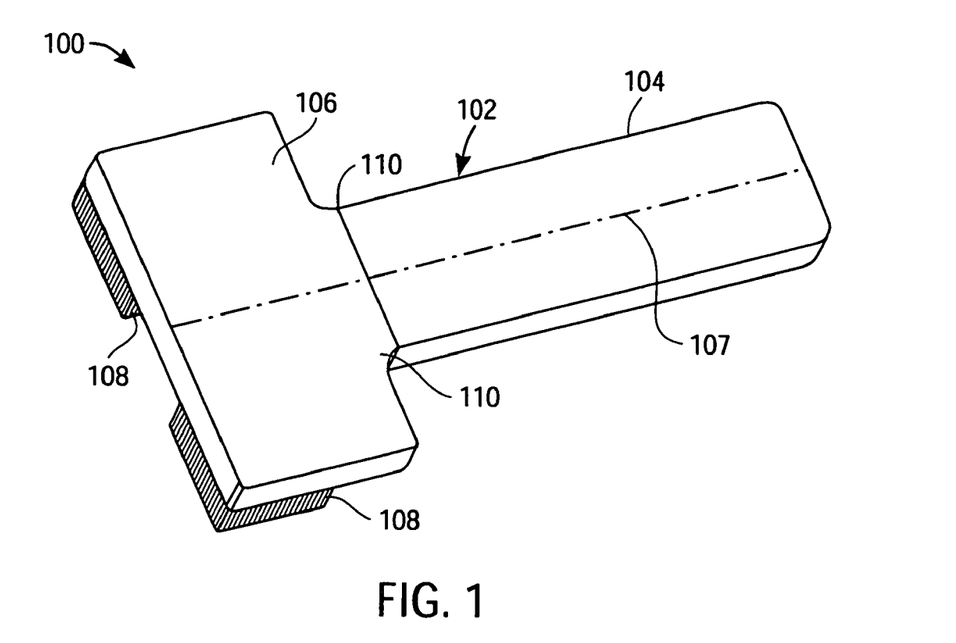
FIG. 1 is a perspective view of a cooling device in accordance with some aspects of the invention.
Figure 2:
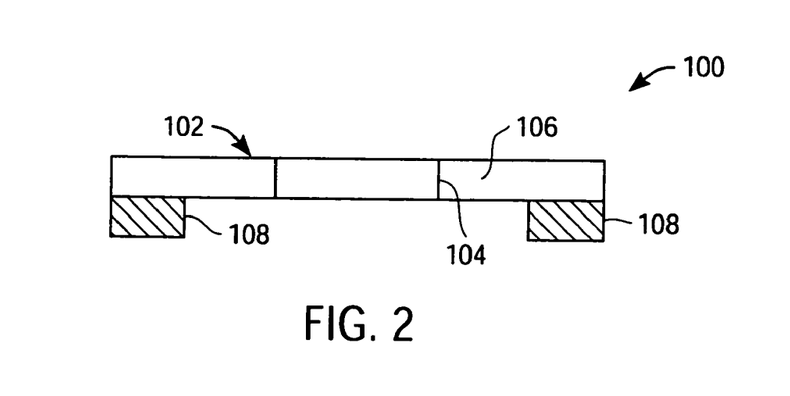
FIG. 2 is a front elevation view of the cooling device of FIG. 1.

FIG. 1 is a perspective view of a cooling device 100 provided in accordance with some aspects of the invention. FIG. 2 is a front elevational view of the cooling device 100.

The cooling device 100 includes a T-shaped blade 102, formed of a long leg 104 and a cross-bar element 106 that is mounted at a central region of the cross-bar element 106 to an end of the leg 104. It will be observed that the T-shaped blade has a T-shaped profile in a horizontal plane. The cross-bar element may have a length that is substantially perpendicular to the longitudinal axis 107 of the long leg 104. The leg 104 may be considered "long" in the sense that it is substantially longer than the length of the cross-bar element 106. Each end of the cross-bar element 106 is supported on a respective piezoelectric element 108. Fillets (i.e., smooth transition regions) 110 are provided at the point where the long leg 104 joins the cross-bar element 106 to promote a smooth transmission of vibrational energy from the cross-bar element 106 to the long leg 104, to reduce stress concentrations and to reduce the possibility of fatigue and cracking. The fillet radius may be selected for ease of manufacture, reduced weight and minimal stress concentrations.

A number of different materials are suitable for forming the blade 102, including, for example, sheet metal or plastic, or another material that vibrates in a suitable fashion when driven by the piezoelectric elements 108, has suitable surface properties and can be satisfactorily coupled to the piezoelectric elements. The blade 102 may be a single unitary piece that may be molded or stamped, for example. The cross-bar element 106 and the long leg 104 need not be of the same material. Various materials and/or methods of joining the two elements may be selected so as to optimize transfer of energy from the cross-bar element 106 to the long leg 104, and from the long leg 104 to ambient air. It may be desirable for the cross-bar element 106 to store and release strain energy to the long leg 104. The cross-bar element 106 may advantageously be more compliant to twisting than the joint between the cross-bar element and the long leg is compliant to flexure, since if the joint were too compliant vibrational energy would not be satisfactorily transferred to the long leg 104.

The surface roughness of the blade may be provided so as to produce a desired flow of air off the blade 102, to effect air separation regions, and to influence boundary layer thickness of the air driven by the blade 102. Chemical etching may be employed and/or the material of the long leg 104 may be selected to obtain the desired degree of surface roughness. Furthermore, the edges of the blade 102 may be rounded, smooth or sharp or both, as needed to optimize the airflow off the blade 102.

In some embodiments, the blade 102 may be less than 2 inches long; for example the blade 102 may be 1 or one-half inch long.

Figure 2A:
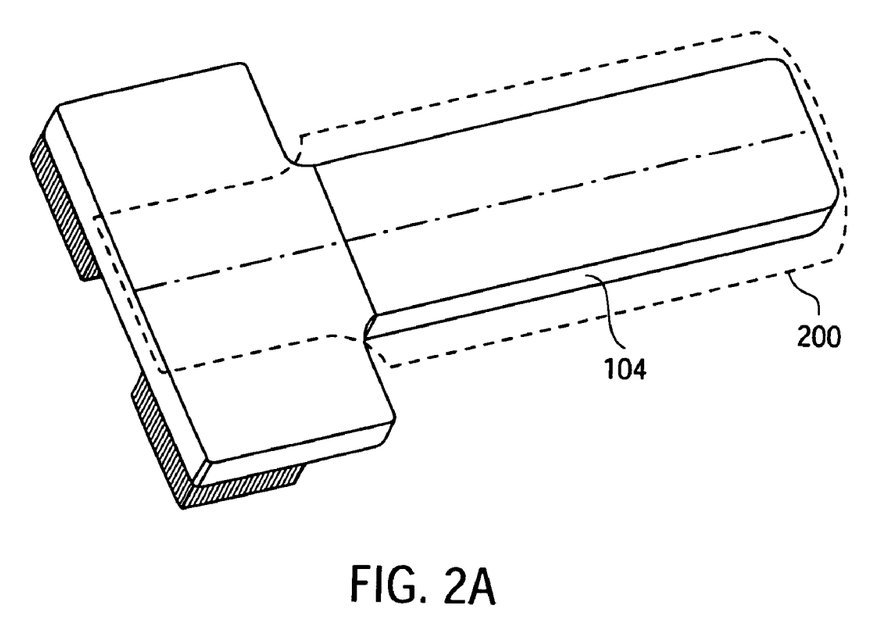
FIG. 2A is a perspective view of another embodiment of the cooling device of FIG. 1.
Figure 2B:
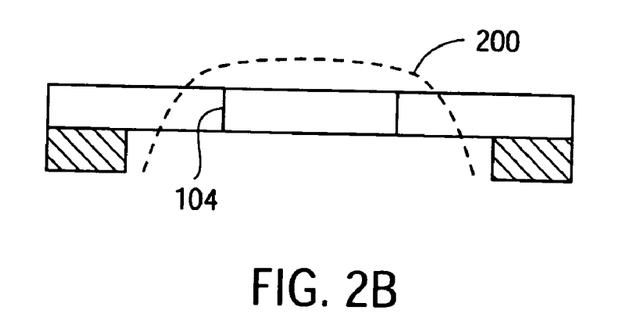
FIG. 2B is a front elevation view of the cooling device of FIG. 2A.

If necessary or desirable to enhance airflow, some or all of the blade 102 may be surrounded by a housing. In the particular example illustrated in FIGS. 2A and 2B, a housing 200 (shown in phantom) generally surrounds the long leg 104 of the blade 102.

The piezoelectric elements 108 may be coupled to the ends of the cross-bar element 106 by adhesive (such as epoxy or cyanoacetate) or mechanically (e.g., by compressing the piezoelectric element 108 in place with a screw or the like). Mechanical coupling by compression may be preferable for piezoelectric elements that require pre-loading. If the blade 102 is formed of polymer, for example, the piezoelectric elements may be inserted into cross-bar element 106 of the blade 102. This can be done by molding the cross-bar element around the piezoelectric element or by ultrasonic welding after the blade 102 is formed.

The piezoelectric elements may be linear longitudinal piezoelectric elements. In some embodiments, the piezoelectric elements are of a multi-layer type to reduce the required voltage. The piezoelectric elements may be "hard" (requiring more than 1000V/mm for polarization) or "soft" (requiring less than 1000V/mm for polarization).

Figure 3:
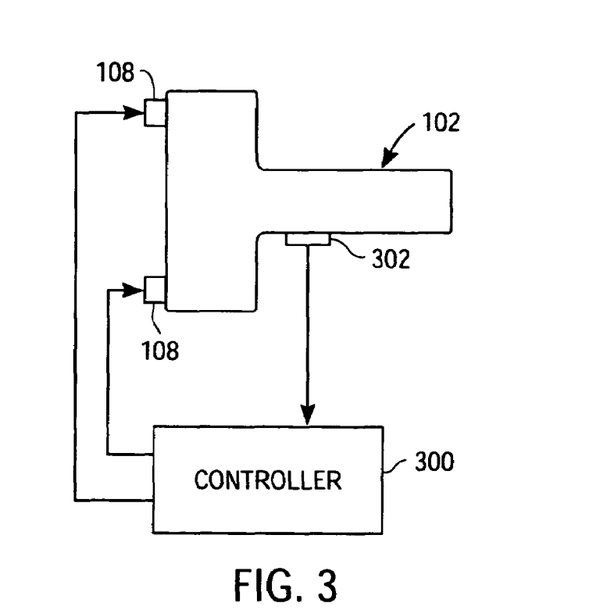
FIG. 3 is a schematic representation of a control arrangement for the cooling device of FIG. 1.

FIG. 3 schematically illustrates a driving circuit arrangement for the piezoelectric elements 108. A driving signal for the piezoelectric elements 108 is provided by a controller/drive circuit 300. The controller 300 may be coupled to receive an output signal from a sensor 302 that is optionally installed on the blade 102. The sensor 302, if present, may be a strain gauge, a displacement sensor or an accelerometer. The driving circuit may be connected to the piezoelectric elements directly or via wires.

In operation, the controller 300 provides a driving signal to the piezoelectric elements 108 so that the piezoelectric elements 108 excite the blade 102 into vibration. Equal signals may be provided to both the piezoelectric elements 108 so that the blade 102 is excited in a manner that is symmetrical about the longitudinal axis 107. Preferably the excitation of the blade 102 is at a frequency that is at or near a resonance frequency of the blade to maximize the deflection of the free end of the blade. Resonance of the blade may be determined or estimated based on the signal output by the sensor 302, if present, and/or by monitoring the current level required to drive the piezoelectric elements 108.

The size and/or composition of the blade 102 may be chosen so that the resonance frequency at which it is excited is in the ultrasonic range, say above 20 kHz (e.g., substantially 40 kHz). Vibration at such a frequency is unlikely to cause any audible noise.

The vibration of the blade 102 may be substantially in an up-and-down direction, producing little air flow as a first order effect. However, in some embodiments, the blade vibration generates substantial airflow in the direction of the long leg 104 as a second order effect akin to acoustic streaming. Thus the cooling device 100 may be positioned with the long leg pointed toward or away from an electronic component (such as a microprocessor) which is to be cooled, and an airflow from the cooling device 100 is directed to the electronic component, or is drawn away from the electronic component, to aid in dissipation of heat from the electronic component. It will be noted that the piezoelectric elements are positioned out of the path of the airflow, thereby improving efficiency of the cooling device.

The mode or modes of vibration of the blade 102 may vary, depending on the frequency at which the blade is driven.

Figure 4:
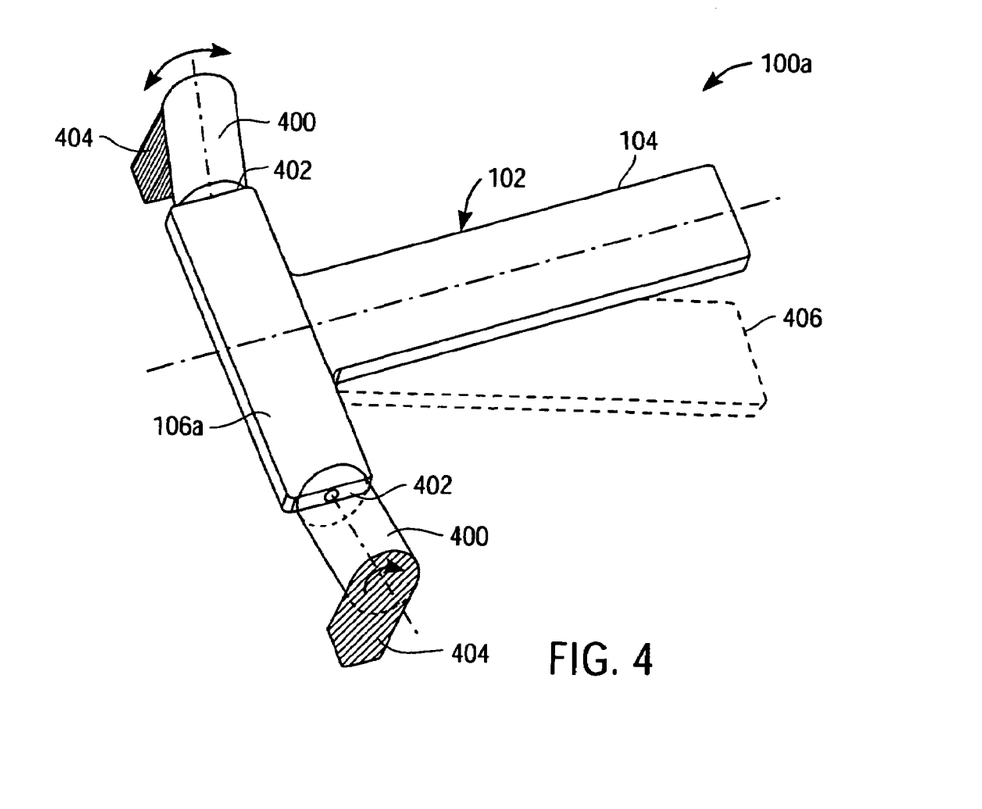
FIG. 4 is a perspective view of another alternative embodiment of the cooling device of FIG. 1.

An alternative embodiment of the cooling device of FIG. 1 is shown in FIG. 4 and is designated by reference numeral 100a. The T-shaped blade 102a that is part of the cooling device 100a may be substantially the same as the blade 102 of FIG. 1. The cooling device 100a may differ from the cooling device 100 principally in the type of piezoelectric elements employed and in the manner of coupling the piezoelectric elements to the blade.

Figure 5:
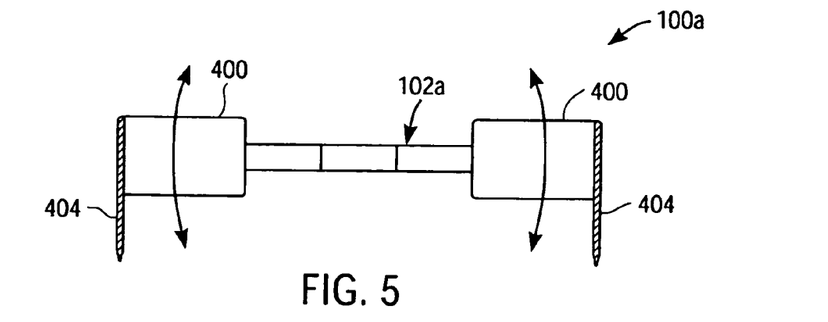
FIG. 5 is a front elevation view of the cooling device of FIG. 4.

In the cooling device 100a, two torsional piezoelectric elements 400 are employed instead of the linear longitudinal piezoelectric elements of the cooling device 100. Each piezoelectric element 400 is coupled to a tip 402 of a respective end of the cross-bar element 106a. As best seen in FIG. 5 (which is a front elevational view of the cooling device 100a), each of the piezoelectric elements 400 is supported on a respective mount 404.

A similar driving circuit arrangement to that illustrated in FIG. 3 may be provided for the cooling device 100a. The piezoelectric elements 400 may be symmetrically driven, producing pivoting of the long leg 104 about the pivot axis defined by the piezoelectric elements 400. The pivoting motion of the long leg 104 is indicated in phantom at 406. The mode or modes of vibration of the blade 102a may vary depending on the frequency at which the blade is driven.

The cooling device 100a may produce an airflow via a second order effect in similar fashion to the cooling device 100 and may thus operate in a similar manner to the cooling device 100.

Figure 6:
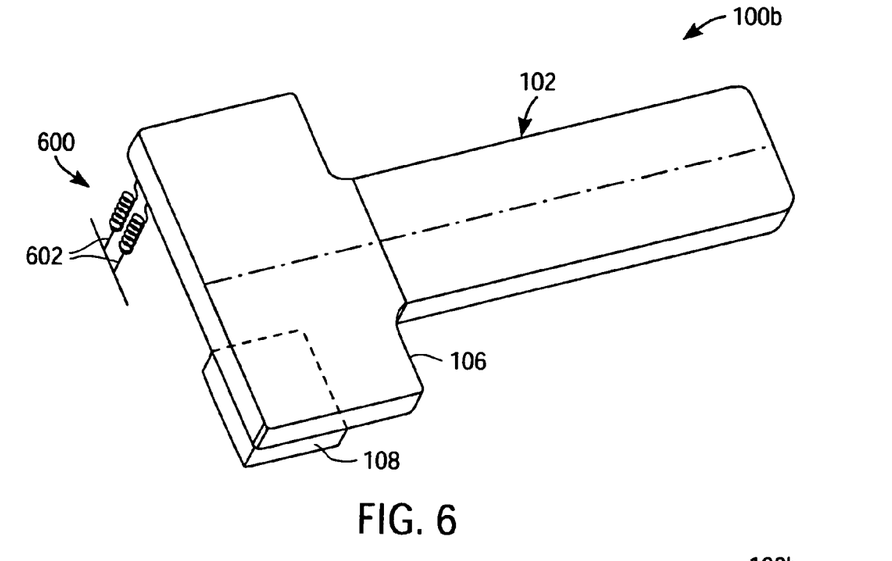
FIG. 6 is a perspective view of still another alternative embodiment of the cooling device of FIG. 1.
Figure 7:
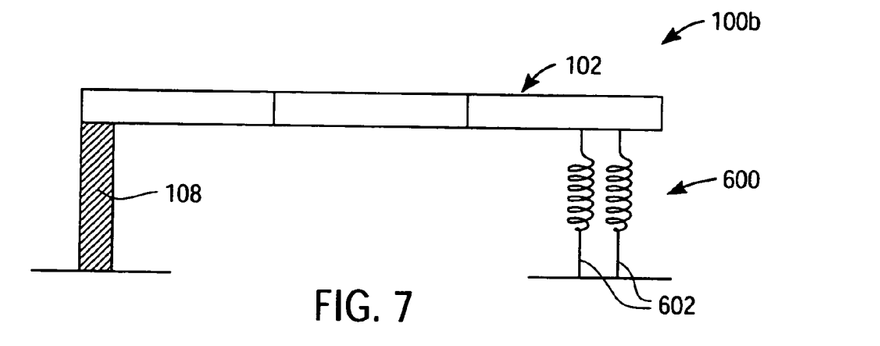
FIG. 7 is a front elevation view of the cooling device of FIG. 6.

Another alternative embodiment of the cooling device of FIG. 1 is illustrated in FIGS. 6 and 7. The cooling device 100b of FIGS. 6 and 7 differs from the cooling device 100 of FIG. 1 principally in that only one piezoelectric device is used in the cooling device 100b. In place of the second piezoelectric element, the cooling device 100b has a flexible support 600. The flexible support may be constituted by one or more springs 602 such as the two springs shown in the drawings. Any number of springs may be provided or another type of flexible support may be employed. If two or more springs are employed, the springs may be arrayed in a line parallel to the longitudinal axis of the cross-bar element 106 (as shown in the drawings) or may be arrayed in a line that is transverse to the longitudinal axis of the cross-bar element or in any other arrangement.

Figure 8:
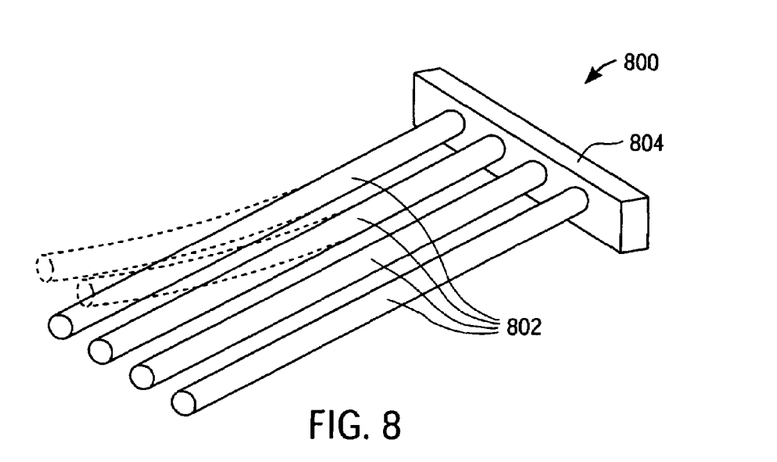
FIG. 8 is a perspective view of another cooling device in accordance with some aspects of the invention.
Figure 9:
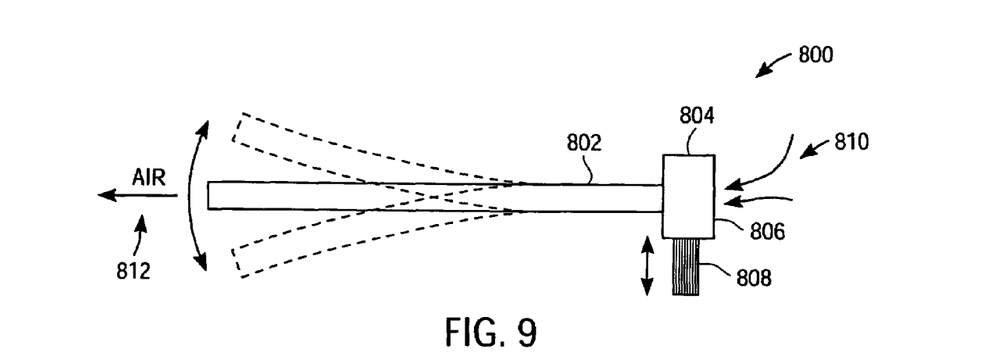
FIG. 9 is a side elevation view of the cooling device of FIG. 8.
Figure 10:
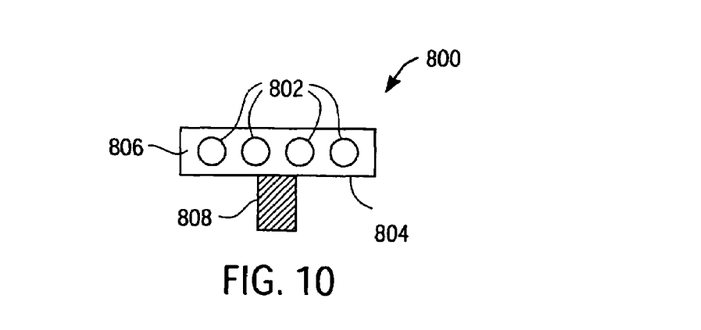
FIG. 10 is a rear elevation view of the cooling device of FIG. 8.

Another type of cooling device provided in accordance with aspects of the invention is illustrated in FIGS. 8-10. FIG. 8 is a perspective view of this type of cooling device (generally indicated by reference numeral 800); FIG. 9 is a side elevational view of the cooling device 800; and FIG. 10 is a rear elevational view of the cooling device 800.

The cooling device 800 includes a plurality of hollow, generally cylindrical tubes 802, each of which is cantilever-mounted at an end of the tube 802 in a force transmission bar 804. The tubes are arranged in side-by-side fashion relative to each other. Each tube is open at both ends. At the proximal ends of the tubes, the open ends communicate with ambient air at a rear side 806 of the force transmission bar 804.

The cooling device 800 also includes a piezoelectric element 808, on which the force transmission bar 804 is mounted at a central region of the force transmission bar. The force transmission bar 804 serves to couple the piezoelectric element 808 to the tubes 802.

The piezoelectric element 808 may be a linear longitudinal piezoelectric element.

The tubes 802 may be formed of any material that does not crack easily under tension. Among preferred materials are metals or polymers with high Q-factors. Examples of such materials include, but are not limited to, brass, stainless steel, polyethylene, and ABS and the like.

The tubes 802 can have an arbitrary cross-section and a uniform or non-uniform wall thickness. Annular cross-sections with constant wall thickness may be preferred because of low cost and ease of manufacture. Tube geometries using other cross-sections are possible and may be preferable in some cases when optimizing for height and tube stiffness. Other possible tube cross-section shapes include elliptical (including an elliptical cross section obtained by compressing a tube which has a circular cross-section), triangular, rectangular and square. The shape and/or dimensions (inner and outer radii, wall thickness, height, width or angle between sides) of the tubes can be varied along the length of the tubes. For example, it may be desirable in some embodiments to have a tube that has a thicker wall toward its proximal end and a thinner wall toward its distal end. Such an arrangement may tend to increase the vibrational amplitude toward the distal end (free end) of the tubes. In other embodiments, either with a constant wall thickness or a reduced wall thickness toward the distal end of the tube, the inner and outer radii of the tube may be increased toward the distal end so that the tube flares outwardly toward its distal end. This may increase airflow out of the tube.

A driving circuit arrangement like that shown in FIG. 3 may be provided for the piezoelectric element 808. The excitation frequency may be tuned to be substantially a resonance frequency of the tubes. In some embodiments, all of the tubes may have substantially the same resonance frequencies. In some embodiments the tubes may be driven at the frequency for their first bending mode. However, higher order modes may be excited exclusively or in concert with the first mode. As in the case of the T-shaped blades described above, the system of tubes preferably have resonance frequencies in an inaudible range, preferably in the ultrasonic range.

As an alternative to a linear longitudinal piezoelectric element, a shearing, torsional or bending-type piezoelectric element may be employed.

The surface roughnesses of the inner surfaces of the tubes may be such as to produce a desired airflow out of the tubes, to effect air separation regions, and to influence boundary layer thickness of the air. Chemical etching and/or selection of the materials of the tubes may be employed to obtain the desired surface roughness. Furthermore, the edges of the distal and proximal holes of the tubes may be rounded, smooth or sharp or both, as required to optimize the airflow.

The tubes 802 may be attached to the force transmission bar 804 with adhesives such as epoxy or cyanoacetate, or by ultrasonic welding. In some embodiments, the force transmission bar 804 is made as stiff as possible, especially at the location where the piezoelectric element is present, to maximize the transmission of force from the piezoelectric element to the tubes. More than one piezoelectric element may be provided in the cooling device 800.

The tubes 802 may be excited so as to vibrate to produce a substantially up-and-down motion at the free ends of the tubes as indicated in phantom in FIGS. 8 and 9. In other embodiments, the free ends of the tubes may vibrate through a generally elliptical or circular path. As in the case of the T-shaped blades, first order effects may produce little airflow, but substantial airflow may be generated by second order effects, causing air to flow into the proximal ends of the tubes 802 and out of the distal ends of the tubes, as indicated at 810, 812 in FIG. 9. It will be noted that once again the piezoelectric element 808 is not in a position to obstruct the airflow. The air flowing out of the respective tubes 808 proceeds substantially in the same direction since the tubes are parallel to each other. The air may be directed to cool an electronic component by positioning the cooling device 800 with the tubes 802 pointing toward the electronic component and exciting the tubes with the piezoelectric element 808. Or, the cooling device 800 may be positioned with the tubes pointing away from the electronic component to draw air away from the electronic component.

Instead of coupling the tubes to the piezoelectric element via a force transmission bar as shown in FIGS. 8-10, one or more of the tubes may be coupled directly to a piezoelectric element. The coupling of the tubes to the piezoelectric element may be, for example, by adhesive (e.g., epoxy or cyanoacetate) or by ultrasonic welding.

The number of tubes included in the cooling device 800 may be more or less than the four tubes shown in FIGS. 8-10. Each tube or group of tubes may be driven by its own piezoelectric element or group of piezoelectric elements. If more than one piezoelectric element is included, the piezoelectric elements may be driven so that the tubes are excited in phase. The cooling device 800 may include only one tube.

The cooling device shown in FIGS. 8-10 could be modified by adding a housing. The housing could generally surround the tubes 802 with open ends at or near the proximal and distal ends of the tubes. The housing could have, for example, an elliptical cross-section.

If an odd number of tubes are included in the cooling device, respective piezoelectric elements may be driven, in some embodiments, so that adjacent tubes vibrate out of phase with each other. Alternatively, with a common piezoelectric element there may be differences between the tubes such that adjacent tubes vibrate out of phase with each other.

As in the case of the cooling device of FIG. 1, the piezoelectric element of the cooling device 800 is positioned so as not to obstruct the flow of air into and out of the tubes 802 and toward the electronic component that is to be cooled.

Figure 11:
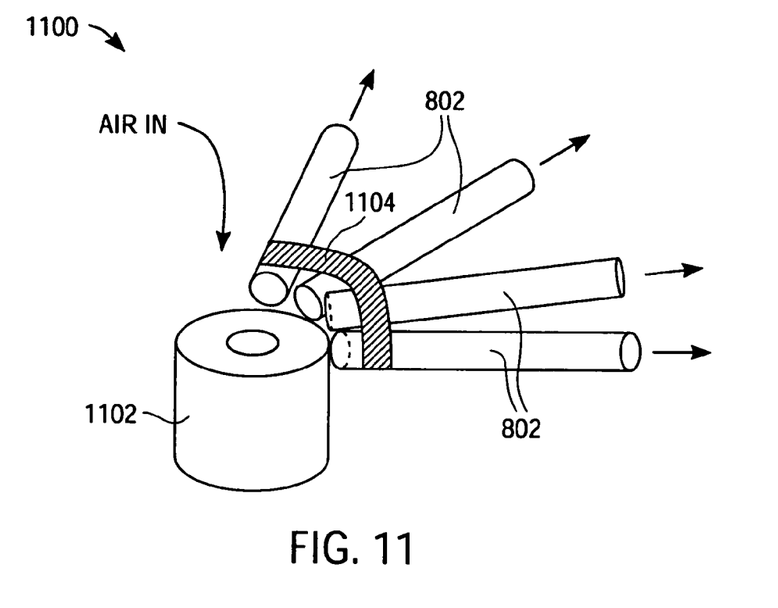
FIG. 11 is a perspective view of another cooling device in accordance with some aspects of the invention.

The tubes need not all be arranged so as to point in the same direction. FIG. 11 is a perspective view of a cooling device 1100 having a plurality of tubes 802 that point in different directions. In this embodiment, the tubes 802 are arranged to point in respective directions that radiate from a central axis of a piezoelectric element 1102 which is provided to drive the tubes 802. The piezoelectric element, in turn, may be driven by a circuit arrangement like that shown in FIG. 3.

In some embodiments, the tubes 802 may be joined together by an adhesive bond, designated by reference numeral 1104 in FIG. 11. The tubes 802 are also coupled to the piezoelectric element 1102, either directly by adhesive bonding or the like, or by a force transmission member, which is not separately shown in FIG. 11.

The piezoelectric element 1102 may be a linear longitudinal piezoelectric element which vibrates the tubes 802 up and down. Alternatively, the piezoelectric element 1102 could be arranged to cause twisting or side-to-side vibration of the tubes. As another alternative, the piezoelectric element could be a torsional piezoelectric element, in which case no pre-loading of the piezoelectric element may be required.

With the radiating orientations of the tubes 802 in the cooling device 1100, the cooling device 1100 may provide an airflow over a relatively wide area In the particular embodiment shown in FIG. 11, the four tubes 802 define an angular extent of about 90°. However, the tubes may be arranged to cover other angular extents, while including more, fewer or the same number of tubes. It is also not necessary that the tubes be arranged in a circular arc. For example, an elliptical arc may be employed.

Figure 12:
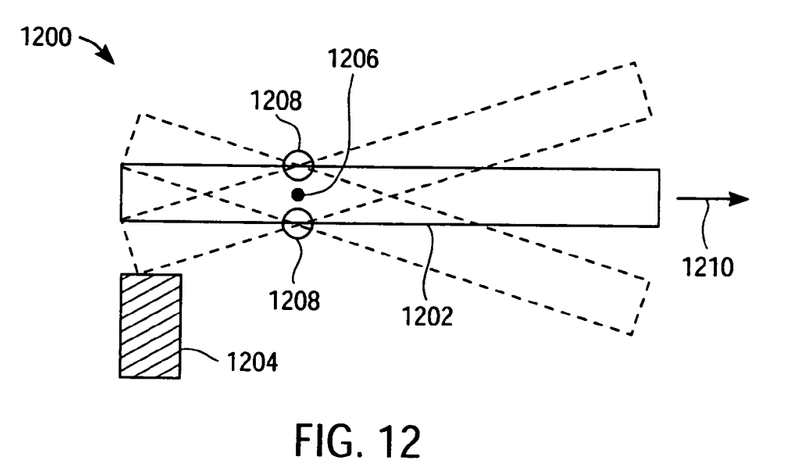
FIG. 12 is a side elevation view of still another cooling device in accordance with some aspects of the invention.

Another embodiment of a cooling device in accordance with aspects of the invention is illustrated in FIG. 12. The cooling device of FIG. 12 is generally indicated by reference numeral 1200. The cooling device 1200 includes a hollow tube 1202 which is coupled at its proximal end to a piezoelectric element 1204. It is assumed that the tube 1202 is vibrationally excited by the piezoelectric element 1204 so as to have a node at a point along the length of the tube. Such a node is indicated at 1206. One or more holes 1208 are formed in the tube 1202 at the node 1206 to allow ambient air to enter the hollow interior of the tube at the node 1206. The air which enters the holes 1208 exits from a hole (not visible in the drawing) at a free end of the tube to provide an airflow as indicated at 1210. The air flow may be directed to an electronic component that is to be cooled.

As in other embodiments described above, the piezoelectric element of the cooling device 1200 is positioned so as not to obstruct the airflow, which proceeds in the holes 1208 and out the free end of the tube 1202.

Figure 13:
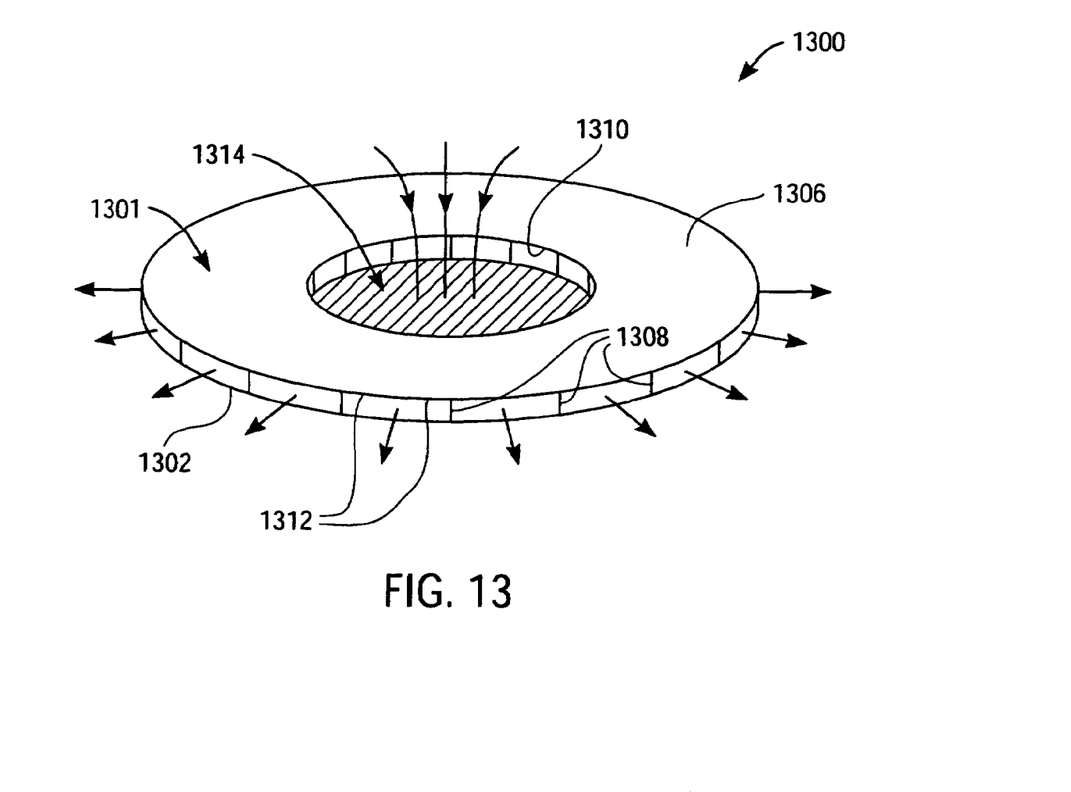
FIG. 13 is a perspective view of yet another cooling device in accordance with some aspects of the invention.
Figure 14:
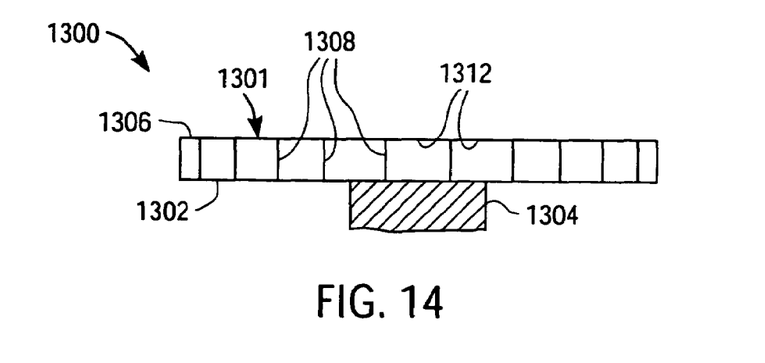
FIG. 14 is a side elevation view of the cooling device of FIG. 13.

FIGS. 13 and 14 illustrate still another cooling device (generally indicated by reference numeral 1300) provided in accordance with other aspects of the invention. FIG. 13 is a perspective view of the cooling device 1300 and FIG. 14 is an elevational view of the cooling device 1300.

A major component of the cooling device 1300 is a channel structure 1301, which includes a base or bottom disk 1302. The disk 1302 is horizontally oriented and is mounted at its center on a piezoelectric element 1304 (FIG. 14). The cooling device 1300 also includes an annulus 1306 which is positioned spaced above, and coaxial with, the disk 1302. A plurality of ribs 1308 extend up from the disk 1302 to the annulus 1306. Each rib corresponds to a respective radius of the disk 1302 and extends radially outwardly from the inlet 1310 of the annulus 1306 to the common periphery of the disk 1302 and the annulus 1306. The ribs 1308 are arranged like the spokes of a wheel so as to be provided all around the circumference of the disk 1302. The ribs define passages 1312 that run from a space 1314 that is above a central region of the disk 1302 to a periphery of the disk 1302.

Driving electronics, which are not shown but which may be like the circuitry of FIG. 3, are provided to drive the piezoelectric element 1304. The piezoelectric element 1304 vibrationally excites the channel structure 1301. The structure 1301 vibrates up and down (i.e., along a central axis of the structure). Air is drawn into the inlet 1310 at the center of the channel structure and flows radially outwardly through the passages 1312. The cooling device 1300 thus may provide a cooling airflow outwardly in all horizontal directions from the cooling device.

Generally in regard to the cooling devices disclosed above, it may sometimes be desirable to have a portion of the airflow into the cooling device pass over the piezoelectric element or elements so as to cool them and keep them from overheating. In other cases it may be preferable not to have the airflow cool the piezoelectric element or elements. In these cases, it may be desirable that the piezoelectric element or elements be rather warm so as to keep them from absorbing moisture, since absorption of moisture could shorten the life of the piezoelectric element or elements. It may also be desirable to operate the piezoelectric element or elements so as to minimize thermal cycling.

When a housing for a vibrating blade or a tube or group of tubes is employed in the cooling device, the housing may be configured to flare outwardly in the direction of airflow.

The cooling devices disclosed herein may operate to dissipate a large amount of heat in a small volume and may fit easily into both portable and non-portable electronic systems that have high packaging density. These cooling devices may also be manufactured with relatively low cost and may be compatible with use in surface mount technology. Accordingly, the cooling devices disclosed herein may fit easily with conventional electronic system designs. The cooling systems disclosed herein may also be efficient and robust in operation, and may be suitable for being powered from batteries.

Cooling devices provided in accordance with aspects of the invention may be employed to aid in cooling integrated circuits, including microprocessors. The cooling devices may be used in high-density electronic devices, which may be, but are not limited to, portable electronics such as laptop computers, PDAs, cellular telephones, etc. The cooling devices disclosed herein may also be used in electrical or electronic devices that are typically stationary. Such devices may include desktop computers, server computers, AC adapters, halogen stalk lamps, circuit breakers, and so forth.

Consider, for example, use of the cooling devices in a server computer. The cooling devices may be incorporated into the layout of the server backplane and may provide air circulation at the backplane, which typically is not reached by the forced air provided from an axial fan or fans that are generally included in server computers. Groups of the cooling devices described herein could be arranged on the backplane to provide an airflow path that is optimal for cooling the server.

Although the system has been described in detail in the foregoing embodiments, it is to be understood that the descriptions have been provided for purposes of illustration only and that other variations both in form and detail can be made thereupon by those skilled in the art without departing from the spirit and scope of the invention, which is defined solely by the appended claims.

What is claimed is:

1. An apparatus comprising:
a T-shaped blade having a long leg and a cross-bar element mounted at a central region of the cross-bar element to one end of the long leg; and
a pair of piezoelectric elements, each coupled to a respective end of the cross-bar element of the T-shaped blade;
wherein the piezoelectric elements drive the blade to vibrate.

2. The apparatus of claim 1, wherein the T-shaped blade is a unitary body.

3. The apparatus of claim 1, wherein the piezoelectric elements are linear piezoelectric elements.

4. The apparatus of claim 1, wherein the piezoelectric elements are torsional piezoelectric elements.

5. The apparatus of claim 4, further comprising:
a pair of mounting members, each positioned to support a respective one of the torsional piezoelectric elements.

6. The apparatus of claim 1, wherein the piezoelectric elements drive the blade to vibrate at an ultrasonic frequency.

7. An apparatus comprising:
a T-shaped blade having a long leg and a cross-bar element mounted at a central region of the cross-bar element to one end of the long leg:
a piezoelectric element coupled to a first end of the cross-bar element; and
a flexible support structure that supports a second end of the cross-bar element.

8. The apparatus of claim 7, wherein the flexible support structure includes a pair of springs.

9. The apparatus of claim 7, wherein the piezoelectric element drives the blade to vibrate at an ultrasonic frequency.

10. The apparatus of claim 1, wherein one end of the long leg is free.

11. The apparatus of claim 1, wherein the piezoelectric elements drive the blade to vibrate substantially in an up-and-down direction.

12. The apparatus of claim 1, wherein each of the piezoelectric elements supports the respective end of the cross-bar element.

13. The apparatus of claim 5, wherein each of the piezoelectric elements is disposed between the respective end of the cross-bar element and a respective one of the mounting members.

* * * * *